United States Patent
Osaga

(10) Patent No.: US 11,876,062 B2
(45) Date of Patent: Jan. 16, 2024

(54) SEMICONDUCTOR DEVICE

(71) Applicant: Mitsubishi Electric Corporation, Tokyo (JP)

(72) Inventor: Tsuyoshi Osaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 204 days.

(21) Appl. No.: 17/624,040

(22) PCT Filed: Oct. 8, 2019

(86) PCT No.: PCT/JP2019/039677
§ 371 (c)(1),
(2) Date: Dec. 30, 2021

(87) PCT Pub. No.: WO2021/070252
PCT Pub. Date: Apr. 15, 2021

(65) Prior Publication Data
US 2022/0399291 A1 Dec. 15, 2022

(51) Int. Cl.
*H01L 23/00* (2006.01)

(52) U.S. Cl.
CPC ............. *H01L 24/05* (2013.01); *H01L 24/03* (2013.01); *H01L 2224/03464* (2013.01);
(Continued)

(58) Field of Classification Search
CPC ............. H01L 23/3192; H01L 23/3171; H01L 23/3107; H01L 29/417; H01L 21/02175;
(Continued)

(56) References Cited

U.S. PATENT DOCUMENTS

2004/0256730 A1 12/2004 Hirano et al.
2007/0158850 A1 7/2007 Hirano et al.
(Continued)

FOREIGN PATENT DOCUMENTS

JP 2005-019798 A 1/2005
JP 2008-182074 A 8/2008

OTHER PUBLICATIONS

International Search Report issued in PCT/JP2019/039677; dated Jan. 7, 2020.

*Primary Examiner* — Mouloucoulaye Inoussa
(74) *Attorney, Agent, or Firm* — Studebaker & Brackett PC

(57) ABSTRACT

The present invention relates to a semiconductor device. The semiconductor device includes: a first main electrode provided on an active region; a second main electrode provided on an opposite side of the semiconductor substrate from the first main electrode; a protection film covering a terminal region; and a non-electrolytic plating layer provided on the first main electrode not covered by the protection film, the first main electrode includes a center electrode in a center part and an outer peripheral electrode provided along the center electrode to be separately from the center electrode, the protection film is provided to extend from the terminal region to an end edge portion of the outer peripheral electrode, the center electrode and the outer peripheral electrode include: a first metal layer; and a second metal layer provided on the first metal layer, and the outer peripheral electrode includes a hole part to reach the first metal layer.

10 Claims, 14 Drawing Sheets

(52) U.S. Cl.
CPC ........... *H01L 2224/05011* (2013.01); *H01L 2224/05083* (2013.01); *H01L 2224/05124* (2013.01); *H01L 2224/05155* (2013.01); *H01L 2224/05166* (2013.01); *H01L 2924/13055* (2013.01); *H01L 2924/35121* (2013.01)

(58) Field of Classification Search
CPC ........... H01L 23/482; H01L 29/7397; H01L 21/02142; H01L 29/0619; H01L 29/407; H01L 29/063; H01L 29/0649; H01L 24/05; H01L 29/401; H01L 24/03; H01L 29/0696; H01L 21/2885; H01L 21/28; H01L 23/53223; H01L 29/7395; H01L 29/7813; H01L 29/66068; H01L 29/7802; H01L 33/06; H01L 29/1608; H01L 21/288; H01L 29/78; H01L 29/41741; H01L 21/768; H01L 21/3205; H01L 29/66325; H01L 23/522; H01L 24/32; H01L 29/739; H01L 29/7393; H01L 29/2003; H01L 24/48; H01L 29/12; H01L 24/26; H01L 2224/05083; H01L 2224/05155; H01L 2224/05124; H01L 2224/0346; H01L 2224/05011; H01L 2224/05166; H01L 2924/35121; H01L 2933/0016; H01L 2924/13055; H01L 2224/04026; H01L 2924/01028; H01L 2924/01079; H01L 2224/04042; H01L 2224/0603; H01L 2224/73265; H01L 2224/8384; H01L 2924/3511; H01L 2924/00014; C23C 18/1675; C23C 18/1669; C23C 18/50; C23C 18/36; C23C 18/54; C23C 18/1844; C23C 18/1803; C23C 18/1655; C23C 18/1651; C23C 18/34; H02M 7/53871; H02M 1/327; H02M 7/003

See application file for complete search history.

(56) References Cited

U.S. PATENT DOCUMENTS

| | | | | |
|---|---|---|---|---|
| 2008/0197442 | A1* | 8/2008 | Hirler | H01L 29/7813 438/587 |
| 2012/0193641 | A1* | 8/2012 | Arai | H01L 29/045 257/E29.313 |
| 2013/0168700 | A1* | 7/2013 | Furukawa | H01L 29/7815 257/77 |
| 2014/0374791 | A1* | 12/2014 | Matsudai | H01L 29/66068 257/139 |
| 2017/0271440 | A1* | 9/2017 | Tanaka | H01L 29/0619 |
| 2018/0233571 | A1* | 8/2018 | Akiyama | H01L 24/03 |
| 2020/0058645 | A1* | 2/2020 | Harada | H01L 29/7396 |

* cited by examiner

SEMICONDUCTOR DEVICE

TECHNICAL FIELD

The present invention relates to a semiconductor device, and particularly to a semiconductor device solder bonding an external electrode electrically connected to an external member and a main electrode of the semiconductor device.

BACKGROUND ART

In a conventional semiconductor device, Patent Document 1 discloses a configuration of solder bonding a surface electrode and an external electrode to reduce conductive resistance of the semiconductor device, for example. In this configuration, there is a possibility that tension stress occurs on the surface electrode due to a thermal cycle when current is applied, and a crack occurs in an end portion of the electrode. The crack extends from the electrode toward an inner side of the semiconductor device, and the semiconductor device electrically breaks down in some cases, and such a state is a problem in improving a thermal cycle tolerated dose of products.

There is a case where alloying of a solder and the surface electrode proceeds due to the thermal cycle, thus the surface electrode needs to be thickened to secure the thermal cycle tolerated dose. Accordingly, it is general to form an electrode using a nickel (Ni) non-electrolytic plating as disclosed in Patent Document 2.

PRIOR ART DOCUMENTS

Patent Documents

Patent Document 1: Japanese Patent Application Laid-Open No. 2008-182074
Patent Document 2: Japanese Patent Application Laid-Open No. 2005-19798

SUMMARY

Problem to be Solved by the Invention

There is a possibility that a crack occurs in an end portion of a surface electrode even in a case where the surface electrode is thickened, and when the crack extends to reach an inner side of a semiconductor device, there is a possibility that the semiconductor device electrically breaks down.

The present disclosure is therefore has been made to solve problems as described above, and it is an object to provide a semiconductor device in which thermal cycle tolerability is improved.

Means to Solve the Problem

A semiconductor device according to the present invention is a semiconductor device in which main current flows in a thickness direction of a semiconductor substrate, wherein the semiconductor substrate includes: an active region in which the main current flows; and a terminal region located on an outer side of the active region, the semiconductor device includes: a first main electrode provided on the active region; a second main electrode provided on an opposite side of the semiconductor substrate from the first main electrode; a protection film covering at least the terminal region; and a non-electrolytic plating layer provided on the first main electrode not covered by the protection film, the first main electrode includes a center electrode in a center part and an outer peripheral electrode provided along the center electrode to be separately from the center electrode, the protection film is provided to extend from the terminal region to an end edge portion of the outer peripheral electrode, the center electrode and the outer peripheral electrode include: a first metal layer; and a second metal layer including aluminum provided on the first metal layer, and at least the outer peripheral electrode includes a hole part passing through the second metal layer to reach the first metal layer.

Effects of the Invention

According to the semiconductor device according to the present invention, the hole part passing through the second metal layer of the outer peripheral electrode to reach the first metal layer is provided, thereby reducing a contact area between the first metal layer and the second metal layer, thus debonding easily occurs at an interface between the first metal layer and the second metal layer. Accordingly, even in a case where a crack (interfacial debonding) occurs along the interface between the protection film and the non-electrolytic plating layer due the thermal cycle, when the crack reaches the outer peripheral electrode, debonding extends in a horizontal direction at the interface between the first metal layer and the second metal layer, and suppressed is a crack extending in a vertical direction, that is to say, in a thickness direction of the semiconductor device, thus a thermal cycle tolerability is improved.

DESCRIPTION OF EMBODIMENT(S)

Introduction

Figure 1:
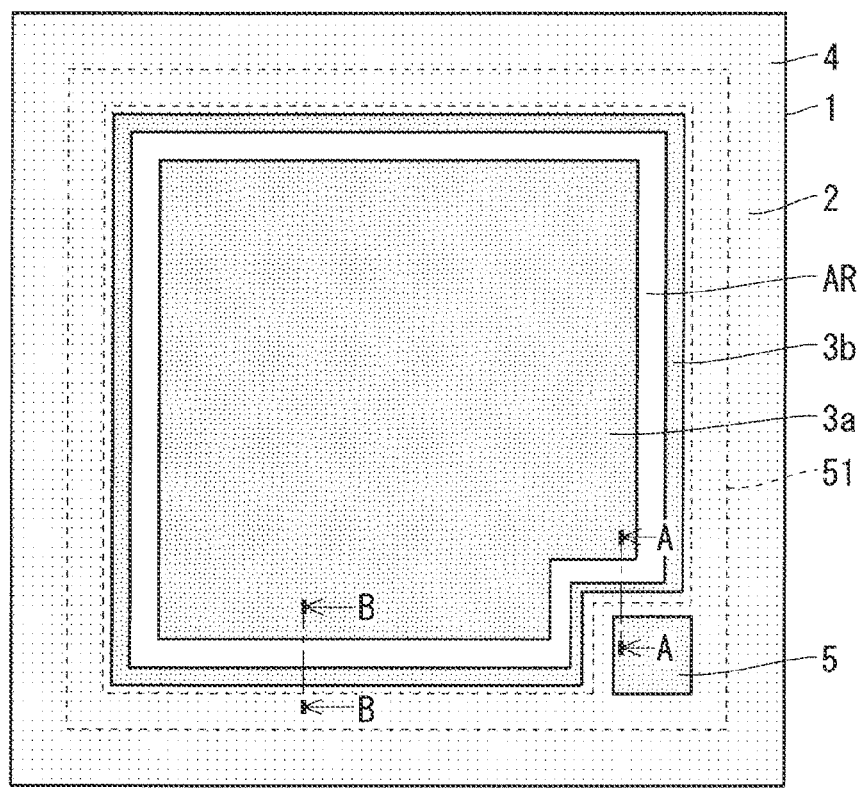
FIG. 1 A plan view illustrating an upper surface configuration of a semiconductor device according to an embodiment 1.

In the description hereinafter, "an active region" is a region in which main current flows when a semiconductor device is in an ON state. In the description hereinafter, "an outer side" is a direction toward an outer periphery of the semiconductor device, and "an inner side" is a direction opposite to "the outer side". In the description hereinafter, with respect to a conductivity type of an impurity, an N type is generally defined as "a first conductivity type" and a P type which is a conductivity type opposite to the N type is defined as "a second conductivity type", however, a reverse definition is also applicable.

The drawings are schematically illustrated, thus a size of an image and a mutual relationship of positions thereof are not necessarily illustrated accurately, but can be appropriately changed. In the description hereinafter, the same reference numerals are assigned to the similar constituent elements in the illustration, and the same applies to names and functions thereof. Thus, a detailed description thereof may be omitted in some cases. When there is descriptions of "on . . . " and "cover . . . " in the present specification, they does not hinder presence of an intervening object between the constituent elements. For example, when there is a description of "B provided on A" or "A covers B", it can mean that the other constituent element C is provided or is not provided between A and B. Used in the description hereinafter are terms each indicating a specific position and direction such as "upper side", "lower side", "lateral side", "bottom", "front", and "rear", for example, however, these terms are used for convenience of easy understanding of contents of the embodiments, and do not relate to a direction in an actual use.

A term of "MOS" is formerly used for a junction structure of metal-oxide-semiconductor, and is considered to be made up of initials of Metal-Oxide-Semiconductor. However, specifically in a field-effect transistor having a MOS structure (simply referred to as "the MOS transistor" hereinafter), materials of a gate insulating film and a gate electrode are improved from a viewpoint of a recent integration and improvement of a manufacturing process.

For example, in the MOS transistor, polycrystal silicon is adopted as a material of a gate electrode in place of metal from a viewpoint of a formation of mainly a source and drain in a self-aligned form. A high-dielectric constant material is adopted as the material of the gate insulating film from a viewpoint of improvement of electrical characteristics, however, the material is not necessarily limited to oxide.

Accordingly, the term of "MOS" is not necessarily adopted only to a lamination structure of metal-oxide-semiconductor, and the present specification is not based on such a premise. That is to say, in view of a technical common knowledge, "MOS" herein has a meaning of not only an abbreviated word derived from an origin of a word but also widely includes a lamination structure of conductor-insulator-semiconductor.

An embodiment of a semiconductor device according to the present invention is described hereinafter. An insulated gate bipolar transistor (IGBT) is described hereinafter as an example of the semiconductor device.

Embodiment 1

<Configuration of Device>

FIG. 1 is a plan view schematically illustrating an upper surface configuration of an IGBT 100 according to an embodiment 1 of the present invention. As illustrated in FIG. 1, the IGBT 100 is provided on a semiconductor substrate 1 having a quadrangular shape in a plan view, and a gate wiring 51 is provided along an outer peripheral part thereof. A gate electrode pad 5 having a quadrangular shape is provided on one corner part of the IGBT 100, and the gate electrode pad 5 is surrounded by the gate wiring 51.

An emitter electrode 3 (a first main electrode) is provided on a major part of a main surface of the IGBT 100 other than a part where the gate electrode pad 5 and the data wiring 51 are provided.

The emitter electrode 3 is provided on an active region AR of the IGBT 100, and the emitter electrode 3 is divided into an emitter center electrode 3a in a center part and an emitter outer peripheral electrode 3b disposed to surround an outer side of the emitter center electrode 3a.

A region on an outer side of an outer periphery of the gate wiring 51 is defined as a terminal region 2. An impurity region for holding withstand voltage may be provided in the terminal region 2, however, an illustration thereof is omitted. A protection film 4 is provided to cover at least the terminal region 2 and the gate wiring 51.

Figure 2:
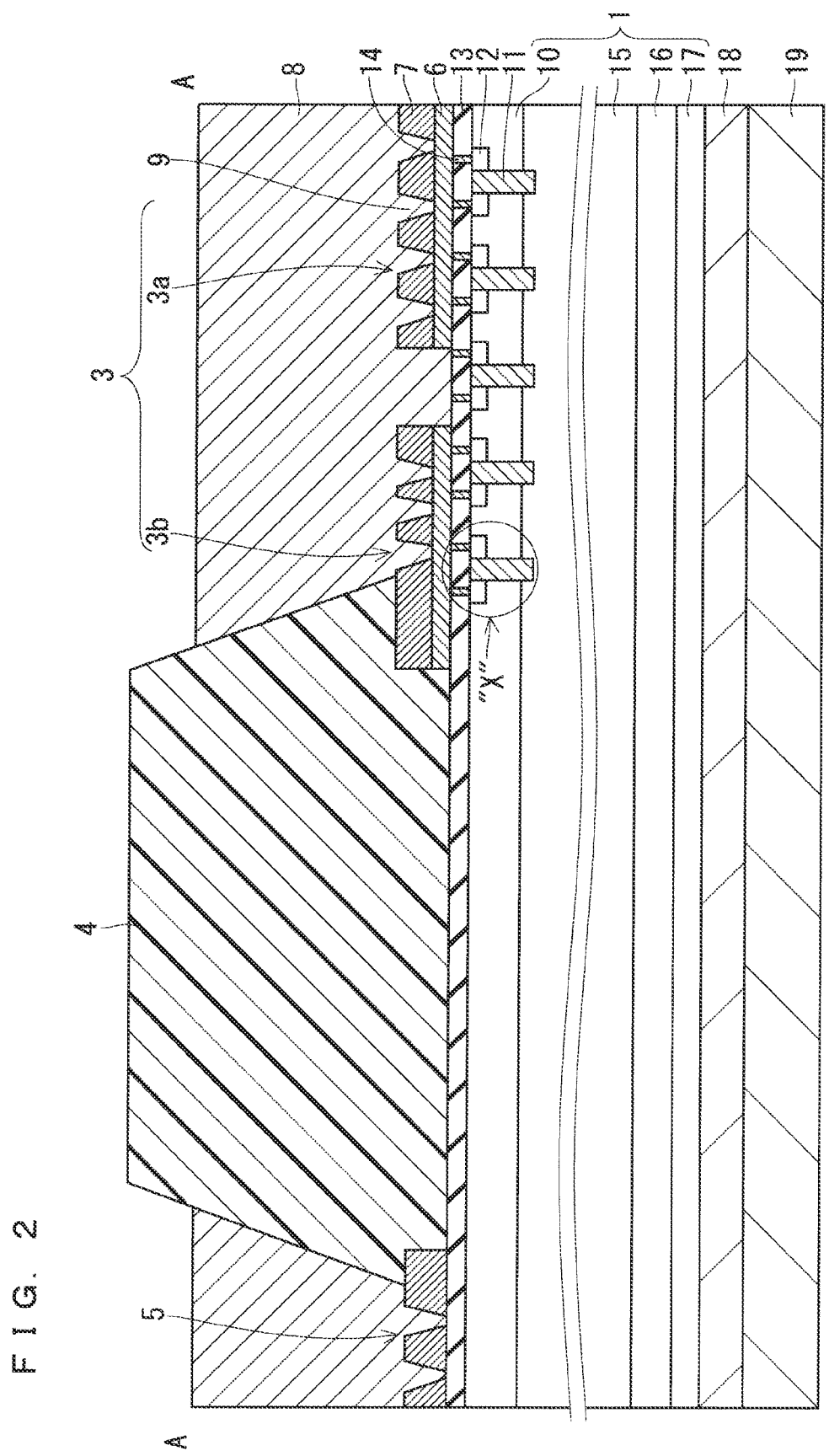
FIG. 2 A partial cross-sectional view illustrating a configuration of the semiconductor device according to the embodiment 1.
Figure 3:
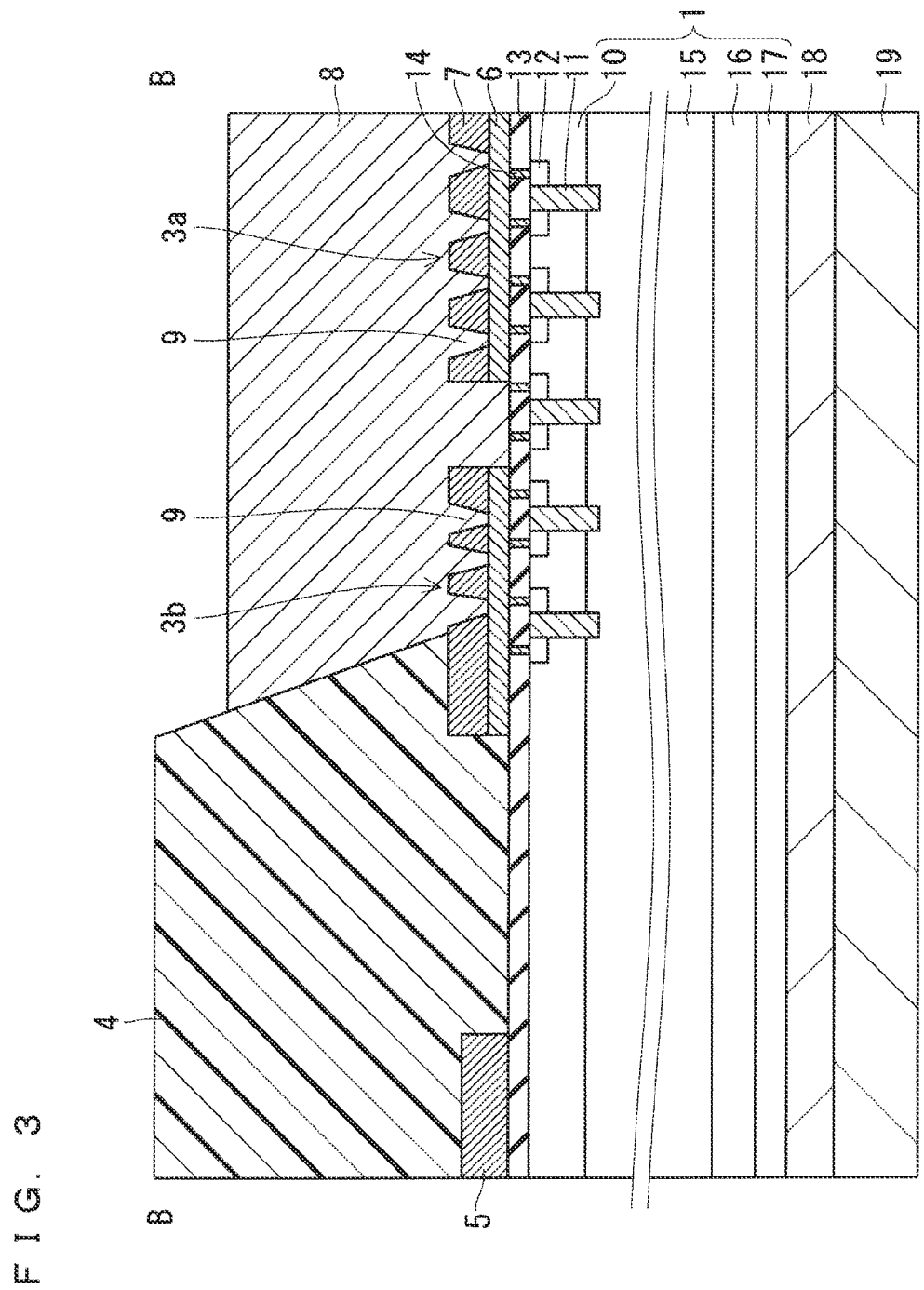
FIG. 3 A partial cross-sectional view illustrating a configuration of the semiconductor device according to the embodiment 1.

A cross-sectional view along an A-A line in an arrow direction in FIG. 1 is illustrated in FIG. 2, and a cross-sectional view along a B-B line in an arrow direction is illustrated in FIG. 3. As illustrated in FIG. 2 and FIG. 3, in the IGBT 100, an N-type drift layer 15 is provided on an upper main surface of an N-type buffer layer 16, and a P-type body layer 10 is provided on an upper layer part of the N-type drift layer 15.

A P-type collector layer 17 is provided on a lower main surface of the buffer layer 16, a metal layer 18 made of aluminum-silicon alloy (AlSi) is provided on a lower main surface of the collector layer 17, and a metal layer 19 made of Nil is provided on a lower main surface of the metal layer 18 to constitute a collector electrode (a second main electrode). The semiconductor substrate 1 includes the collector layer 17, the buffer layer 16, the drift layer 15 and the body layer 10.

On an upper layer part of the body layer 10, the plurality of N-type emitter layers 12 are selectively provided, and a plurality of trench gate electrodes 11 passing through the emitter layer 12 and the body layer 10 in a thickness direction to reach the drift layer 15 are provided.

An interlayer insulating film 13 is provided on the drift layer 15 (on the body layer 10), and a plurality of contact electrodes 14 passing through the interlayer insulating film 13 in a thickness direction to reach the emitter layer 12 are provided in the interlayer insulating film 13.

The emitter center electrode 3a and the emitter outer peripheral electrode 3b have a stacking structure made up of a metal layer 6 (a first metal layer) provided on the interlayer insulating film 13 to have contact with the plurality of contact electrodes 14 and a metal layer 7 (a second metal layer) provided on the metal layer 6, and a plating layer 8 is provided on the metal layer 7. Herein, the metal layer 6 is a barrier metal of Ti/TiN in which titanium (Ti) is stacked on titanium nitride (TiN), for example, the metal layer 7 is an aluminum layer, for example, and the plating layer 8 is a non-electrolytic nickel plating layer (a non-electrolytic plating layer) of phosphorated nickel (NiP), for example.

A hole part 9 passing through the metal layer 7 in a thickness direction to reach an upper side of the metal layer 6 is formed in the metal layer 7, and the hole part 9 is filled with the plating layer S.

The protection film 4 made of polyimide, for example, is provided to cover a range from an upper side of an edge portion of the gate electrode pad 5 to an upper side of an outer edge portion of the emitter outer peripheral electrode 3b in FIG. 1 and a range from an upper side of an outer edge portion of the emitter outer peripheral electrode 3b to an upper side of the gate wiring 51 in FIG. 2.

Figure 4:
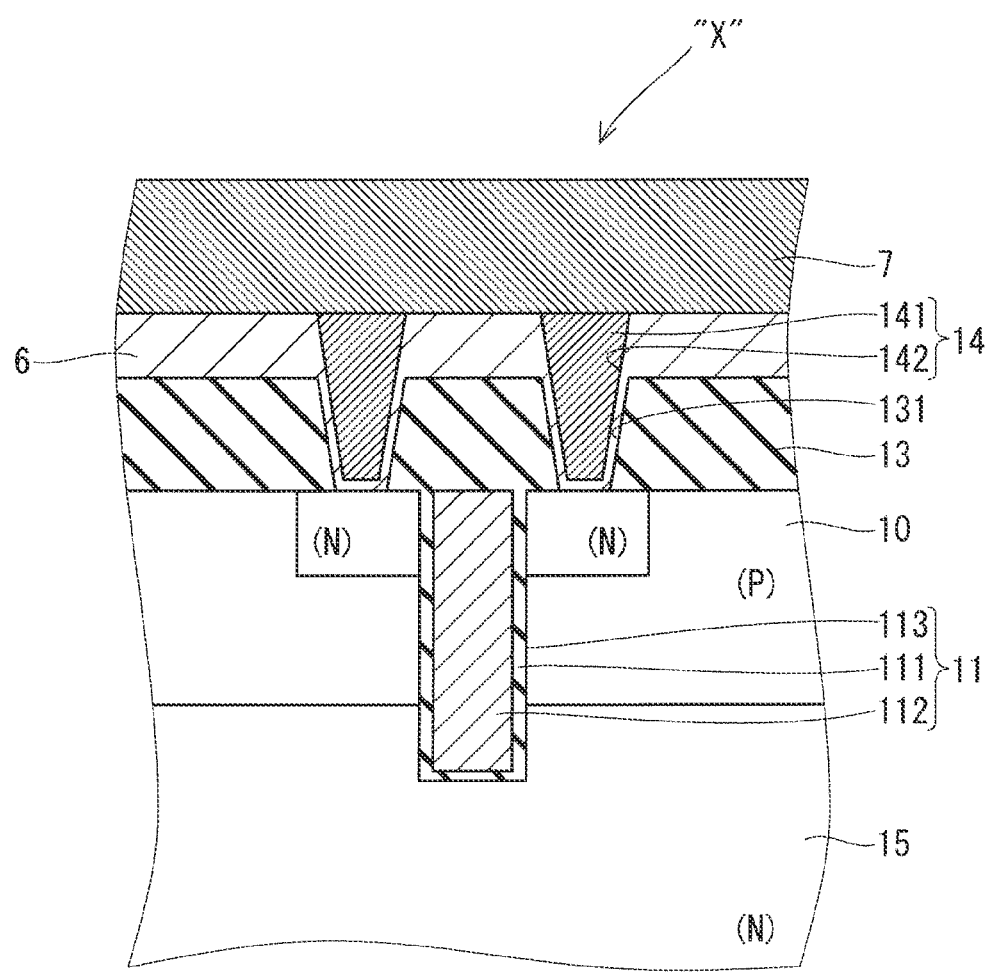
FIG. 4 A partial enlarged view illustrating a configuration of the semiconductor device according to the embodiment 1.

Herein, an enlarged view of a region "X" in FIG. 2 is illustrated in FIG. 4. FIG. 4 is a drawing illustrating a trench gate electrode 11 and a contact electrode 14 in detail. As illustrated in FIG. 4, in the trench gate electrode 11, a gate insulating film 111 is provided to cover an outer surface of a gate trench 113 passing through the emitter layer 12 and the body layer 10 in the thickness direction to reach an inner side of the drift layer 15, and a gate electrode 112 is embedded into the gate trench 113 covered by the gate insulating film 111.

An upper side of the trench gate electrode 11 is covered by the interlayer insulating film 13, and is electrically connected to the gate wiring 51 via an opening part of the interlayer insulating film 13 provided in a portion not shown in the drawings, thereby having a configuration that gate voltage is supplied.

The metal layer 6 is embedded in an opening part 131 passing through the interlayer insulating film 13 in the thickness direction to reach the emitter layer 12 in the contact electrode 14. Furthermore, a tungsten (W) layer 142 is embedded in an opening part 141 in the metal layer 6 embedded in the opening part 131, and the metal layer 6 and the tungsten layer 142 constitute the contact electrode 14. The metal layer 6 is provided to reduce contact resistance of the metal layer 7 and the tungsten layer 142 (the contact electrode 14).

Figure 5:
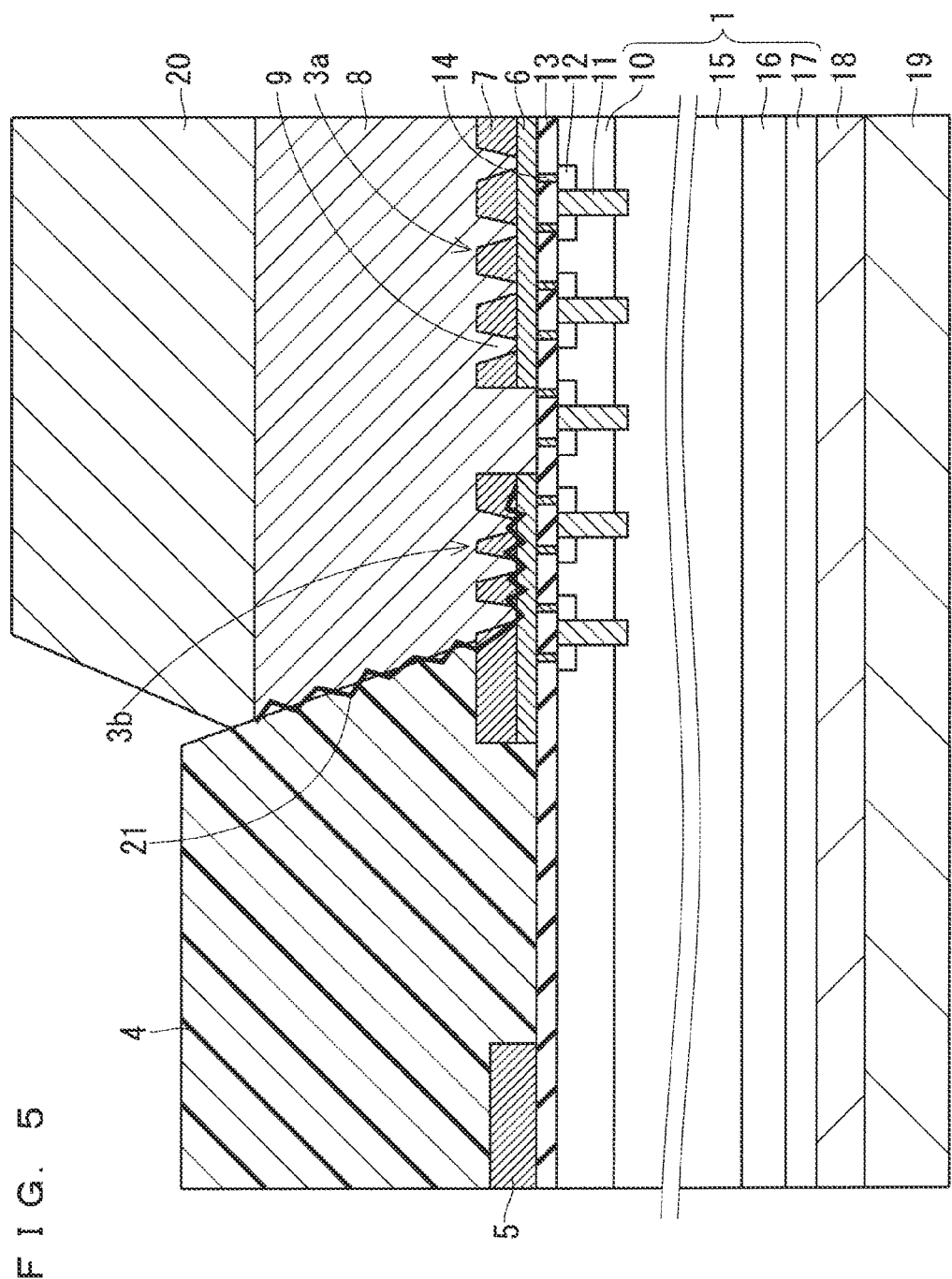
FIG. 5 A cross-sectional schematically illustrating a crack occurring when a thermal cycle caused by applying current is applied to the semiconductor device according to the embodiment 1.

FIG. 5 is a cross-sectional view schematically illustrating a crack 21 occurring when a solder layer 20 is bonded to the plating layer 8 and a thermal cycle caused by applying current is applied.

As illustrated in FIG. 5, when the crack 21 occurring due to the thermal cycle extends along an interface between the protection film 4 and the plating layer 8 and has contact with the metal layer 7, a crack (interfacial debonding) occurs at the interface between the plating layer 8 and the metal layer 7 firstly. Subsequently, when the debonding reaches an upper side of the metal layer 6, debonding occurs at an interface between the metal layer 7 and the metal layer 6 by reason that a contact area between the metal layer 6 and the metal layer 7 is reduced by forming the hole part 9. As a result, the debonding extends in a horizontal direction, and suppressed is an extension of debonding in a vertical direction, that is to say, a thickness direction of the IGBT 100, thus suppressed is a breakdown of an element structure of the IGBT 100, and a life of a device can be made longer than ever before.

The debonding at the interface extends on the emitter outer peripheral electrode 3b, however, the emitter outer peripheral electrode 3b and the emitter center electrode 3a are separated from each other, thus suppressed is a crack extending to the emitter center electrode 3a.

<Manufacturing Method>

Figure 6:
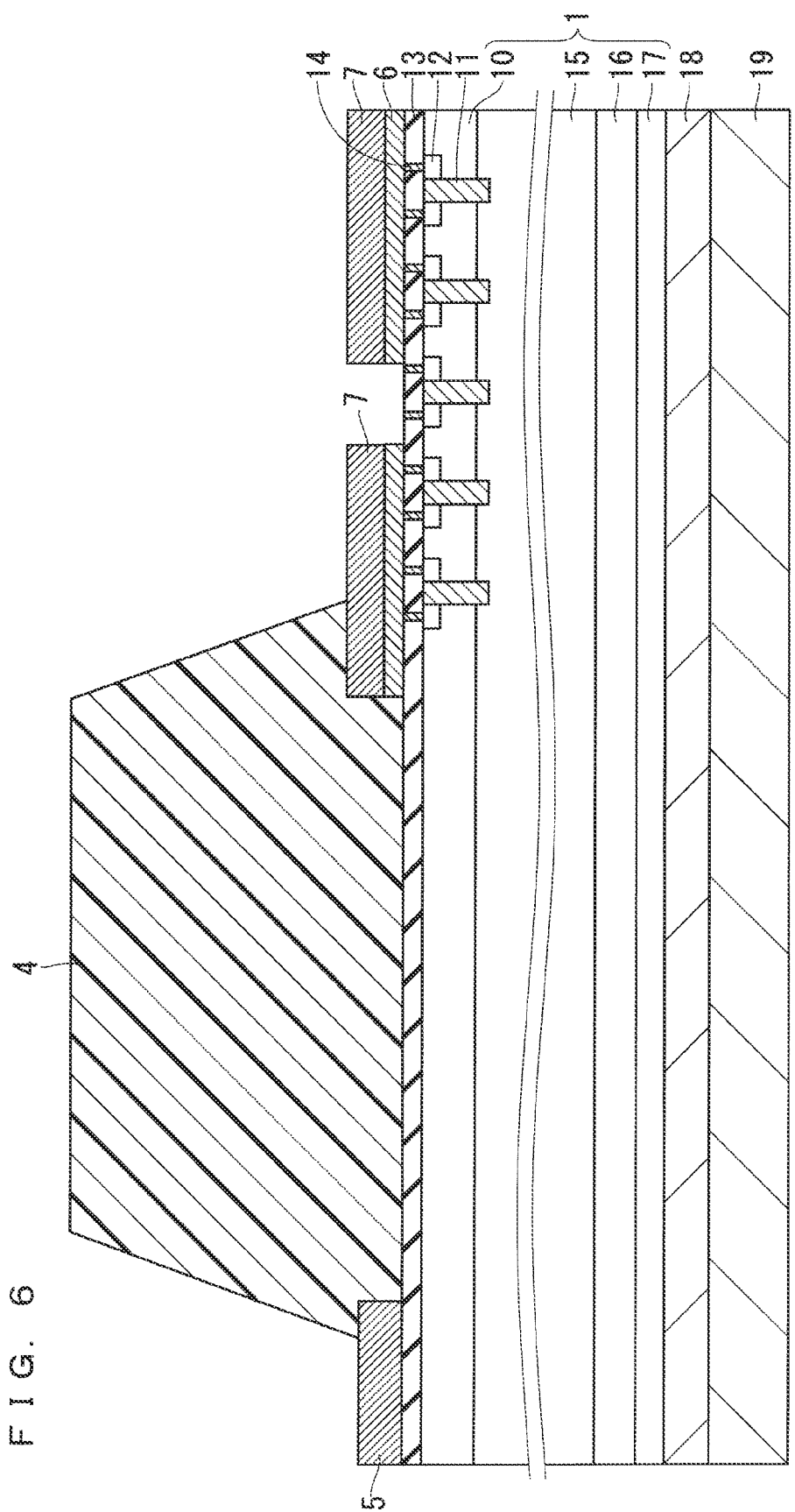
FIG. 6 A partial cross-sectional view for describing a method of manufacturing the semiconductor device according to the embodiment 1.

A method of manufacturing the IGBT 100 is described next using FIG. 6 and FIG. 7 which are cross-sectional views illustrating a manufacturing process sequentially. The configuration below the interlayer insulating film 13 is well known, and known technique can be used for a manufacturing method thereof, thus the description is omitted.

After the configuration below the interlayer insulating film 13 is formed using a conventional technique, in a process illustrated in FIG. 6, the contact electrode 14 is formed in the interlayer insulating film 13, a barrier metal made of Ti/TiN is formed on the interlayer insulating film 13 to constitute the metal layer 6, and an aluminum layer is formed on the metal layer 6 to constitute the metal layer 7, for example. The metal layer 7 may be an aluminum alloy layer.

The metal layer 6 is formed on the active region, but is not formed on a formation region of the gate electrode pad 5 and the gate wiring 51, and the stacking structure of the metal layer 6 and the metal layer 7 is formed on the active region. It is also applicable that the metal layer 6 is also formed in the formation region of the gate electrode pad 5 and the gate wiring 51 to constitute a stacking structure with the metal layer 7.

The stacking structure of the metal layer 6 and the metal layer 7 and the metal layer 7 are patterned by a photolithography process and an etching process, and a region where the protection film 4 has contact with the interlayer insulating film 13 and a region separating the emitter center electrode 3a and the emitter outer peripheral electrode 3b are opened. The protection film 4 is selectively formed by polyimide, for example. A well-known etching process can be used for etching the metal layer 6 and the metal layer 7.

Figure 7:
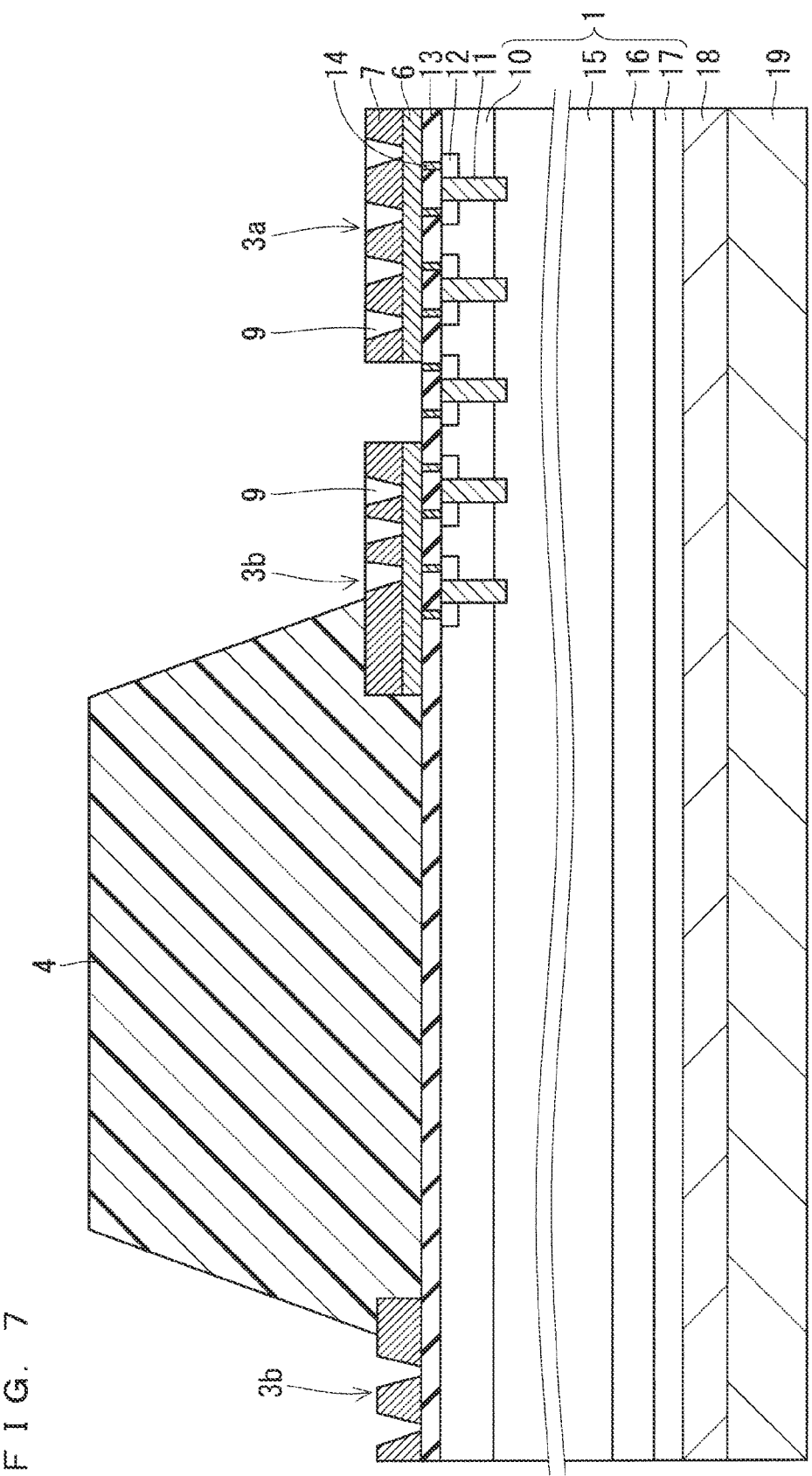
FIG. 7 A partial cross-sectional view for describing a method of manufacturing the semiconductor device according to the embodiment 1.

Next, Al pitting corrosion is generated in the metal layer 7 by performing zincate processing as preprocessing prior to a formation of the plating layer 8 by performing non-electrolytic NiP plating on aluminum, and the plurality of hole parts 9 passing through the metal layer 7 in the thickness direction are formed as illustrated in FIG. 7.

Herein, a depth of the Al pitting corrosion by the zincate processing is approximately 0.5 µm to 1 µm, thus a thickness of the metal layer 7 is set to equal to or larger than 0.5 µm to equal to or smaller than 1 µm, and more preferably approximately 0.5 µm, thus the hole part 9 reliably passes through the metal layer 7. A thickness of the metal layer 6 is approximately 0.1 µm, and a thickness of the plating layer 8 is approximately 5 µm.

Subsequently, the plating layer 8 is formed by performing non-electrolytic NiP plating to obtain the IGBT 100 having the cross-sectional configuration illustrated in FIG. 2 and FIG. 3.

The Al pitting corrosion performed by the zincate processing is used as the hole part 9, thus a processing treatment of forming the hole part 9 in the metal layer can be omitted. Accordingly, a process and a cost necessary for the processing can be reduced, and reduction in productivity by providing the hole part 9 can be suppressed.

Embodiment 2

Figure 8:
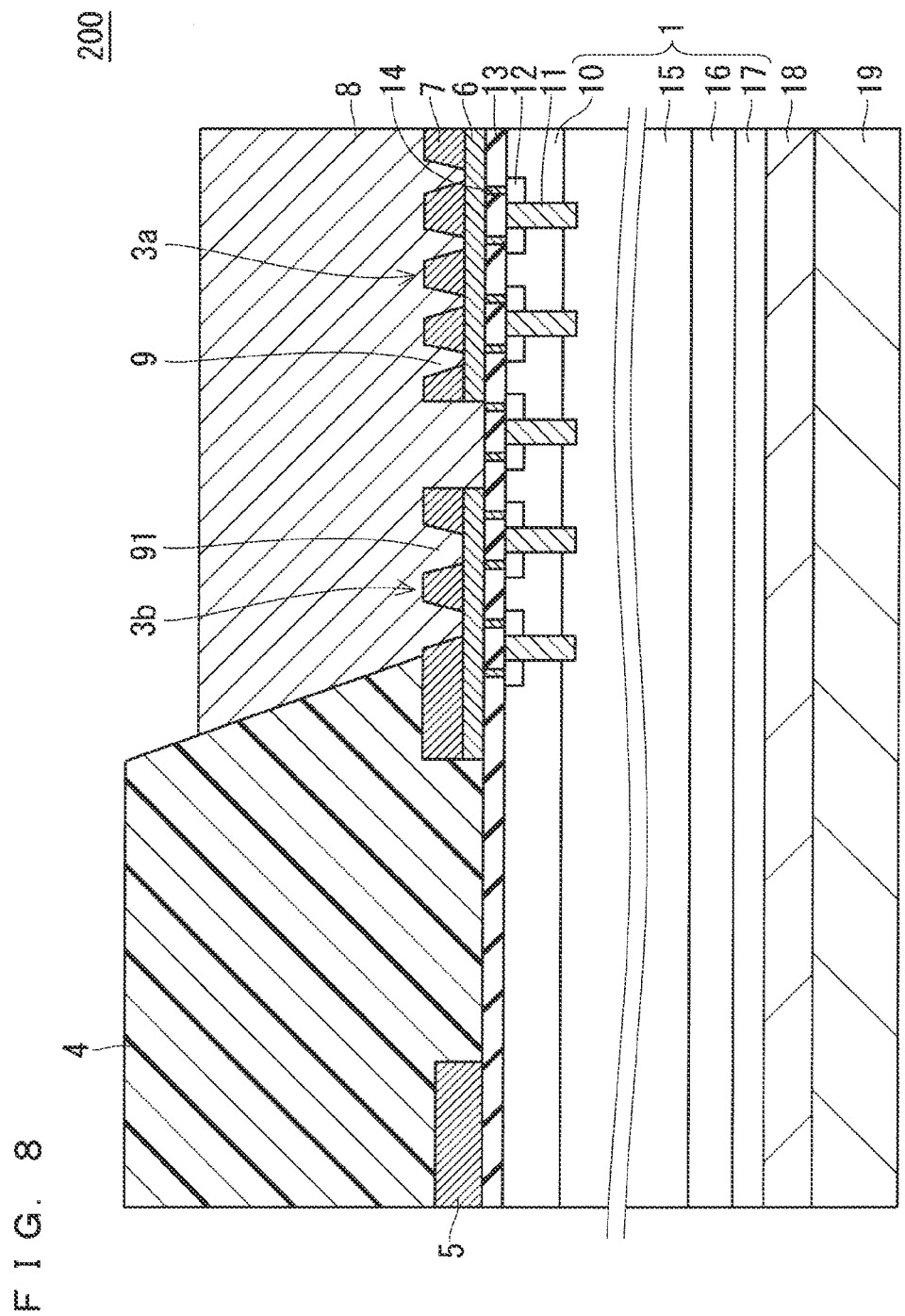
FIG. 8 A partial cross-sectional view illustrating a configuration of a semiconductor device according to an embodiment 2.

FIG. 8 is a cross-sectional view illustrating a configuration of an IGBT 200 of an embodiment 2 according to the present invention, and corresponds to a cross-sectional view along a B-B line in an arrow direction in FIG. 1. An upper surface configuration of the IGBT 200 is the same as a plan view of the IGBT 100 illustrated in FIG. 1.

As illustrated in FIG. 8, a hole part 91 in an emitter outer peripheral electrode 3*b* is formed larger than the hole part 9 in the emitter center electrode 3*a* in the IGBT 200. The hole part 91 in the emitter outer peripheral electrode 3*b* is made large, thus a crack (interfacial debonding) occurring when a thermal cycle is applied to the IGBT 200 can extend more reliably in a horizontal direction of the emitter outer peripheral electrode 3*b*, and suppressed is an extension of debonding in a vertical direction, that is to say, in a thickness direction of the IGBT 200, thus suppressed is a breakdown of an element structure of the IGBT 200, and a life of a device can be made longer than ever before.

In order to form the hole part 91 in the emitter outer peripheral electrode 3*b* to be larger than the hole part 9 in the emitter center electrode 3*a* as described above, separately performed is a process of forming a part to be the emitter center electrode 3*a* and the gate electrode pad 5 (not shown) and a part to be the emitter outer peripheral electrode 3*b*, and the part of the metal layer 7 to be the emitter outer peripheral electrode 3*b* is formed by a different film material so that a silicon concentration thereof is higher than that of the part of the metal layer 7 to be the emitter center electrode 3*a* and the gate electrode pad 5 in the formation of the metal layer 7 made of AlSi.

Normally, an Si content rate of AlSi is approximately 1%. The content rate thereof is increased to approximately 10%, thus silicon nodule (silicon segregation) is formed in large amounts in the metal layer 7. In the zincate processing prior to the formation of the plating layer 8, silicon nodule is also debonded from the metal layer 7, thus the hole part 91 larger than the hole part 9 in the emitter center electrode 3*a* is formed in the part of the metal layer 7 to be the emitter outer peripheral electrode 3*b*.

A sputtering method is used for forming the metal layer 7, and a sputtering target having a different Si composition ratio is used, thus an Si concentration can be made different in the part to be the emitter center electrode 3*a* and the part to be the emitter outer peripheral electrode 3*b* and the gate electrode pad 5. That is to say, it is sufficient that in forming the part of the metal layer 7 to be the emitter center electrode 3*a* and the gate electrode pad 5 (not shown), the sputtering target having an Si composition ratio of approximately 1% is used, and in forming the part to be the emitter outer peripheral electrode 3*b*, the sputtering target having an Si composition ratio of approximately 10% is used.

Embodiment 3

<Configuration of Device>

Figure 9:
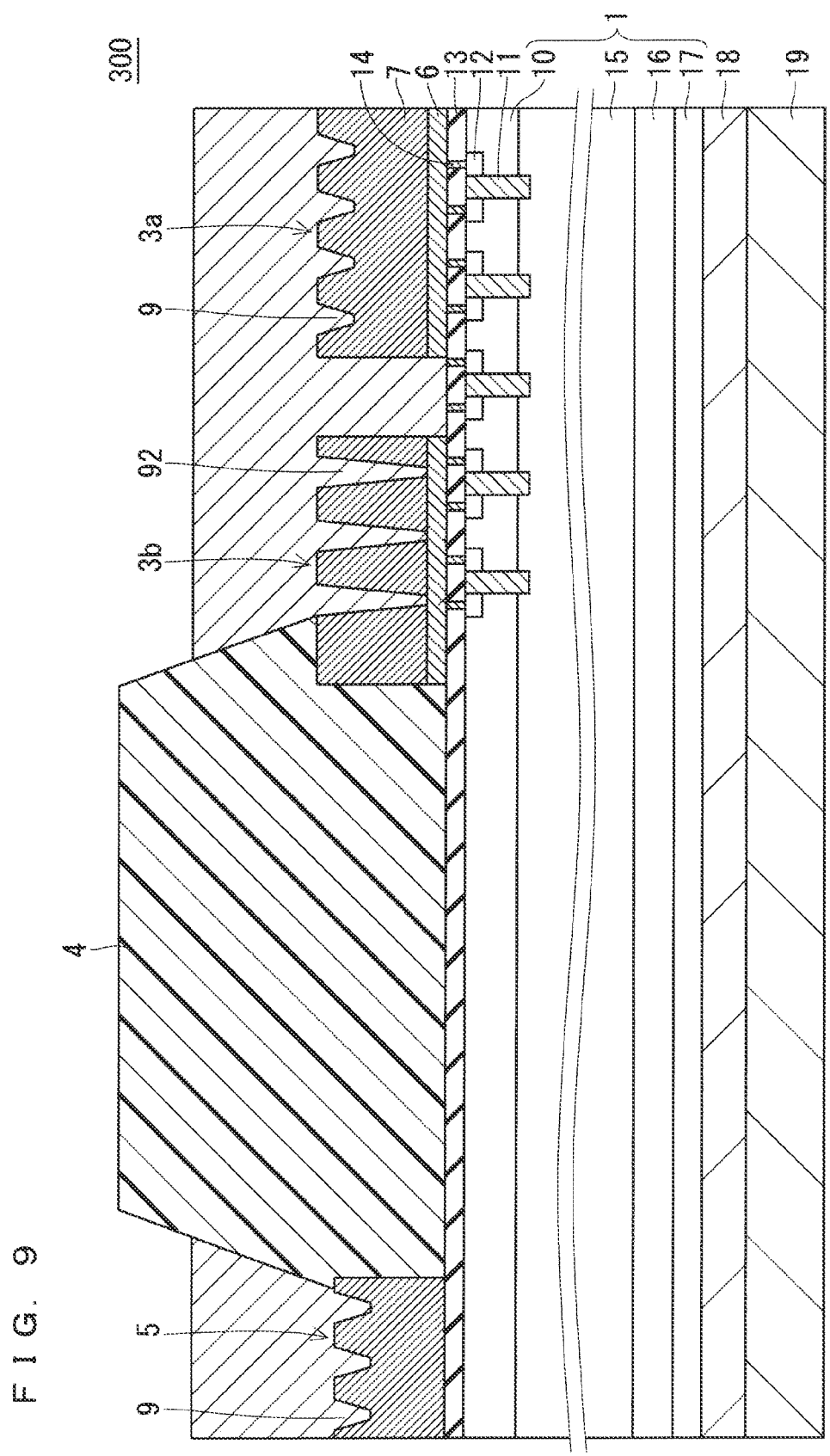
FIG. 9 A partial cross-sectional view illustrating a configuration of a semiconductor device according to an embodiment 3.

FIG. 9 is a cross-sectional view illustrating a configuration of an IGBT 300 of an embodiment 3 according to the present invention, and corresponds to a cross-sectional view along an A-A line in an arrow direction in FIG. 1. An upper surface configuration of the IGBT 300 is the same as a plan view of the IGBT 100 illustrated in FIG. 1.

As illustrated in FIG. 9, in the IGBT 300, a hole part 92 in the emitter outer peripheral electrode 3*b* is formed deeper and larger than the hole part 9 in the emitter center electrode 3*a* and the gate electrode pad 5, and the hole part 92 in the emitter outer peripheral electrode 3*b* passes through the metal layer 7 to reach an upper side of the metal layer 6, however, the hole part 9 in the emitter center electrode 3*a* and the gate electrode pad 5 does not pass through the metal layer 7.

The hole part 92 in the emitter outer peripheral electrode 3*b* passes through the metal layer 7 to reach the upper side of the metal layer 6, thus a crack (interfacial debonding) occurring when a thermal cycle is applied to the IGBT 300 can extend in the horizontal direction of the emitter outer peripheral electrode 3*b*, and suppressed is an extension of debonding in a vertical direction, that is to say, in a thickness direction of the IGBT 300, thus suppressed is a breakdown of an element structure of the IGBT 300, and a life of a device can be made longer than ever before.

Herein, the hole part 92 in the emitter outer peripheral electrode 3*b* is a hole selectively formed by etching, and the hole part 9 and the gate electrode pad 5 in the emitter center electrode 3*a* are formed by Al pitting corrosion by the zincate processing prior to the formation of the plating layer 8, and is a hole non-selectively formed.

<Manufacturing Method>

A method of manufacturing the IGBT 300 is described next using FIG. 10 and FIG. 11 which are cross-sectional views illustrating a manufacturing process sequentially. The configuration below the interlayer insulating film 13 is well known, and known technique can be used for a manufacturing method thereof, thus the description is omitted.

After the configuration below the interlayer insulating film 13 is formed using a conventional technique, the contact electrode 14 is formed in the interlayer insulating film 13, a barrier metal made of Ti/TiN is formed on the interlayer insulating film 13 to constitute the metal layer 6, and an aluminum layer is formed on the metal layer 6 to constitute the metal layer 7, for example. The metal layer 6 is formed on the active region, but is not formed on a formation region of the gate electrode pad 5 and the gate wiring 51, and the stacking structure of the metal layer 6 and the metal layer 7 is formed on the active region. It is also applicable that the metal layer 6 is also formed in the formation region of the gate electrode pad 5 and the gate wiring 51 to constitute a stacking structure with the metal layer 7.

The stacking structure of the metal layer 6 and the metal layer 7 and the metal layer 7 are patterned by a photolithography process and an etching process, and a region where the protection film 4 has contact with the interlayer insulating film 13 and a region separating the emitter center electrode 3*a* and the emitter outer peripheral electrode 3*b* are opened. The protection film 4 is selectively formed by polyimide, for example.

Figure 10:
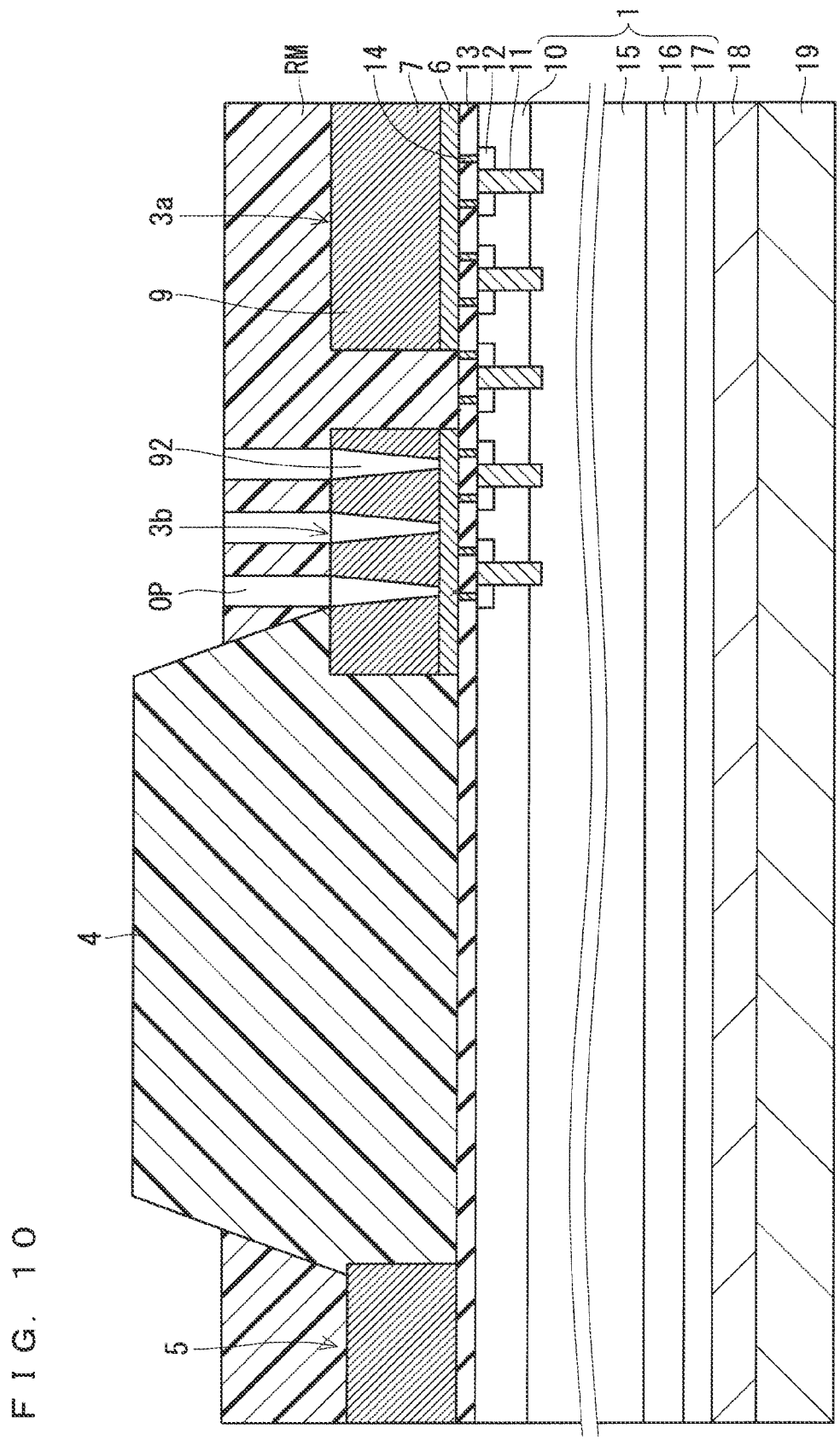
FIG. 10 A partial cross-sectional view for describing a method of manufacturing the semiconductor device according to the embodiment 3.
Figure 11:
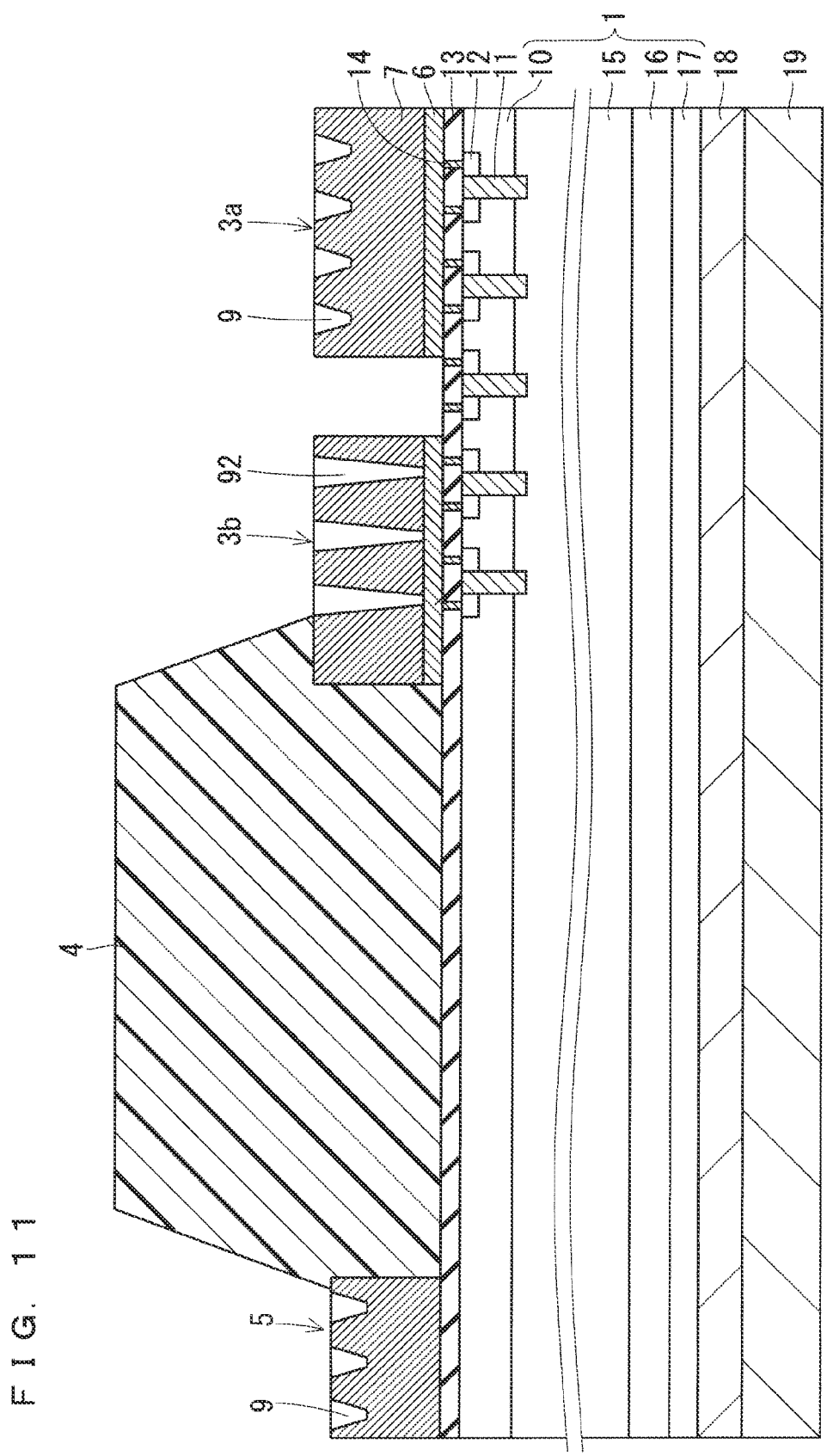
FIG. 11 A partial cross-sectional view for describing a method of manufacturing the semiconductor device according to the embodiment 3.

Subsequently, after a photolithography process again, in a process illustrated in FIG. 10, provided on the part of the metal layer 7 to be the emitter outer peripheral electrode 3*b* is a resist mask RM in which a part to be the hole part 92 becomes an opening part OP. The resist mask RM does not have an opening part other than the opening part OP, the upper side of the part of the metal layer 7 to be the emitter center electrode 3*a* and the gate electrode pad 5 is covered by the resist mask RM.

Subsequently, the stacking structure of the metal layer 6 and the metal layer 7 is etched via the opening part OP by the etching process, thus the hole part 92 passing through the metal layer 7 to reach the upper side of the metal layer 6 is formed.

After the resist mask RM is removed, the zincate processing is performed prior to the formation of the plating layer 8 by the non-electrolytic NiP plating on aluminum. Accordingly, as illustrated in FIG. 11, the Al pitting corrosion occurs in the part of the metal layer 7 to be the emitter center electrode 3*a* and the gate electrode pad 5, thus the hole part 9 is formed.

Herein, the thickness of the metal layer 7 is equal to or larger than 1.5 μm, thus the hole part 9 cannot pass through the metal layer 7, and does not reach the upper side of the metal layer 6 in the emitter center electrode 3a and the gate electrode pad 5. The thickness of the metal layer 7 is preferably equal to or larger than 1.5 μm and equal to or smaller than 2 μm from a viewpoint of securing flatness of the plating layer 8.

The Al pitting corrosion also occurs in the emitter outer peripheral electrode 3b by the zincate processing, however, the thickness of the metal layer 7 is equal to or larger than 1.5 μm, thus the hole part 9 by the Al pitting corrosion cannot pass through the metal layer 7, and the illustration thereof is omitted.

Subsequently, the plating layer 8 is formed by performing non-electrolytic NiP plating to obtain the IGBT 300 having the cross-sectional configuration illustrated in FIG. 9.

The hole part 92 in the emitter outer peripheral electrode 3b is formed by etching in this manner, a size, a shape, the number, and an arrangement pattern of the hole part 92 can be optionally set, thus the extension of the crack (interfacial debonding) at the interface between the metal layer 7 in the emitter outer peripheral electrode 3b and the metal layer 6 can be controlled, and the crack can reliably extend in the horizontal direction.

The hole part 9 in the emitter center electrode 3a and the gate electrode pad 5 cannot pass through the metal layer 7, thus contact between the metal layer 6 and the plating layer 8 having large contact resistance can be avoided. Accordingly, a contact area between the metal layer 6 and the metal layer 7 having small contact resistance is increased, and resistance in applying current is reduced and an electrical performance of the IGBT 300 is improved.

Embodiment 4

Figure 12:
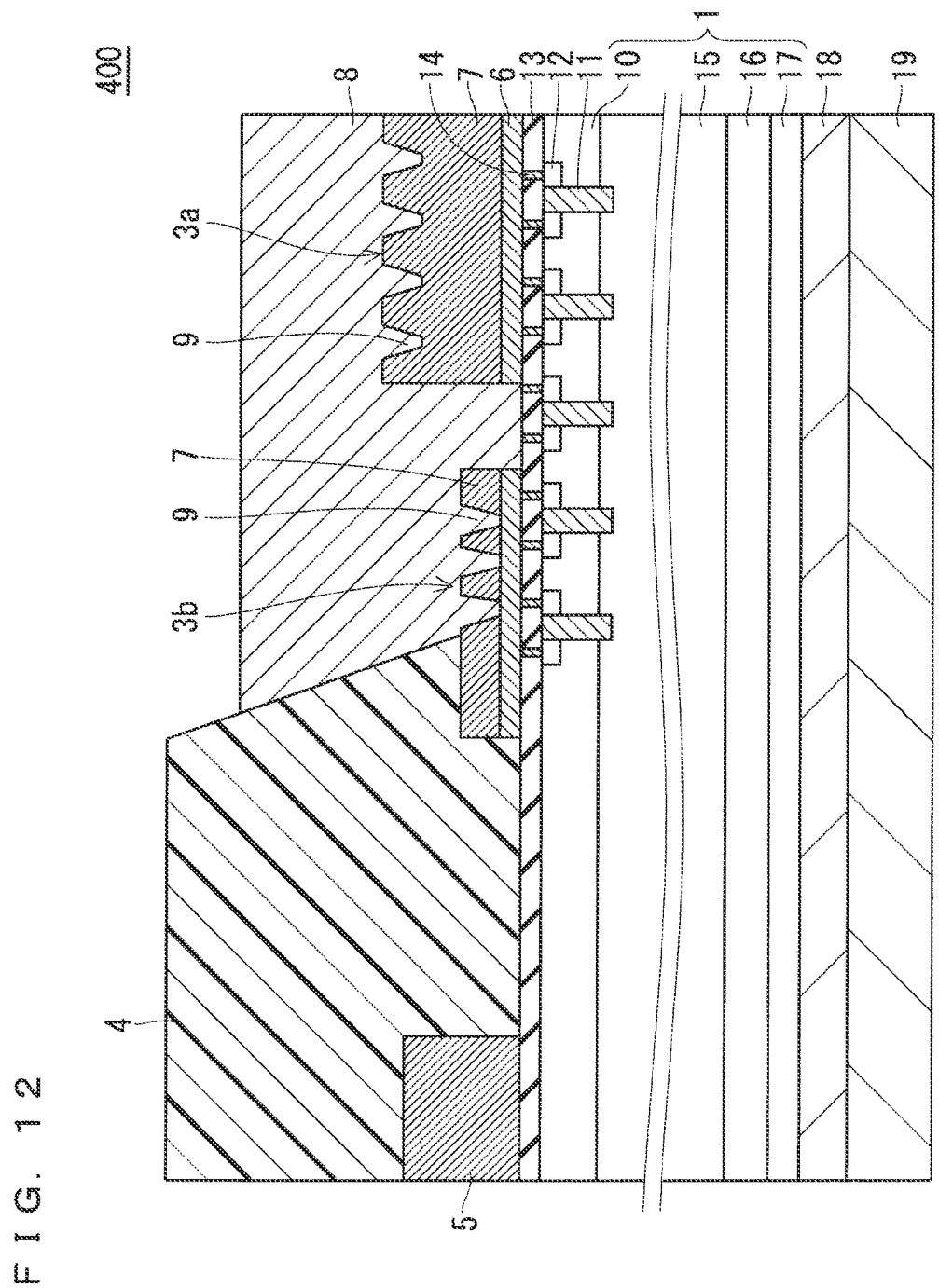
FIG. 12 A partial cross-sectional view illustrating a configuration of a semiconductor device according to an embodiment 4.

FIG. 12 is a cross-sectional view illustrating a configuration of an IGBT 400 of an embodiment 4 according to the present invention, and corresponds to a cross-sectional view along a B-B line in an arrow direction in FIG. 1. An upper surface configuration of the IGBT 400 is the same as a plan view of the IGBT 100 illustrated in FIG. 1.

As illustrated in FIG. 12, in the IGBT 400, the thickness of the metal layer 7 in the emitter center electrode 3a and the gate electrode pad 5 is larger than that of the metal layer 7 in the emitter outer peripheral electrode 3b, and the hole part 9 in the emitter center electrode 3a does not pass through the metal layer 7. In the meanwhile, the hole part 9 in the emitter outer peripheral electrode 3b passes through the metal layer 7 to reach the upper side of the metal layer 6.

In order to form the metal layer 7 in the emitter center electrode 3a and the gate electrode pad 5 to have the thickness larger than the metal layer 7 in the emitter outer peripheral electrode 3b as described above, separately performed is a process of forming the part to be the emitter center electrode 3a and the gate electrode pad 5 and the part to be the emitter outer peripheral electrode 3b in the formation of the metal layer 7.

The thickness of the part of the metal layer 7 to be the emitter center electrode 3a and the gate electrode pad 5 is set to equal to or larger than 1.5 pan, and the thickness of the part of the metal layer 7 to be the emitter outer peripheral electrode 3b is set to equal to or larger than 0.5 μm and equal to or smaller than 1 μm, and more preferably approximately 0.5 μm, thus the hole part 9 reliably passes through the metal layer 7. The thickness of the part the metal layer 7 to be the emitter center electrode 3a and the gate electrode pad 5 is preferably equal to or larger than 1.5 μm and equal to or smaller than 2 μm from a viewpoint of securing flatness of the plating layer 8.

According to such a configuration, in the emitter outer peripheral electrode 3b, a crack (interfacial debonding) occurring when a thermal cycle is applied to the IGBT 400 can extend in the horizontal direction of the emitter outer peripheral electrode 3b, and suppressed is an extension of debonding in a vertical direction, that is to say, in a thickness direction of the IGBT 400, thus suppressed is a breakdown of an element structure of the IGBT 400, and a life of a device can be made longer than ever before.

The hole part 9 in the emitter center electrode 3a and the gate electrode pad 5 cannot pass through the metal layer 7, thus contact between the metal layer 6 and the plating layer 8 having large contact resistance can be avoided. Accordingly, a contact area between the metal layer 6 and the metal layer 7 having small contact resistance is increased, and resistance in applying current is reduced and an electrical performance of the IGBT 400 is improved.

Embodiment 5

Figure 13:
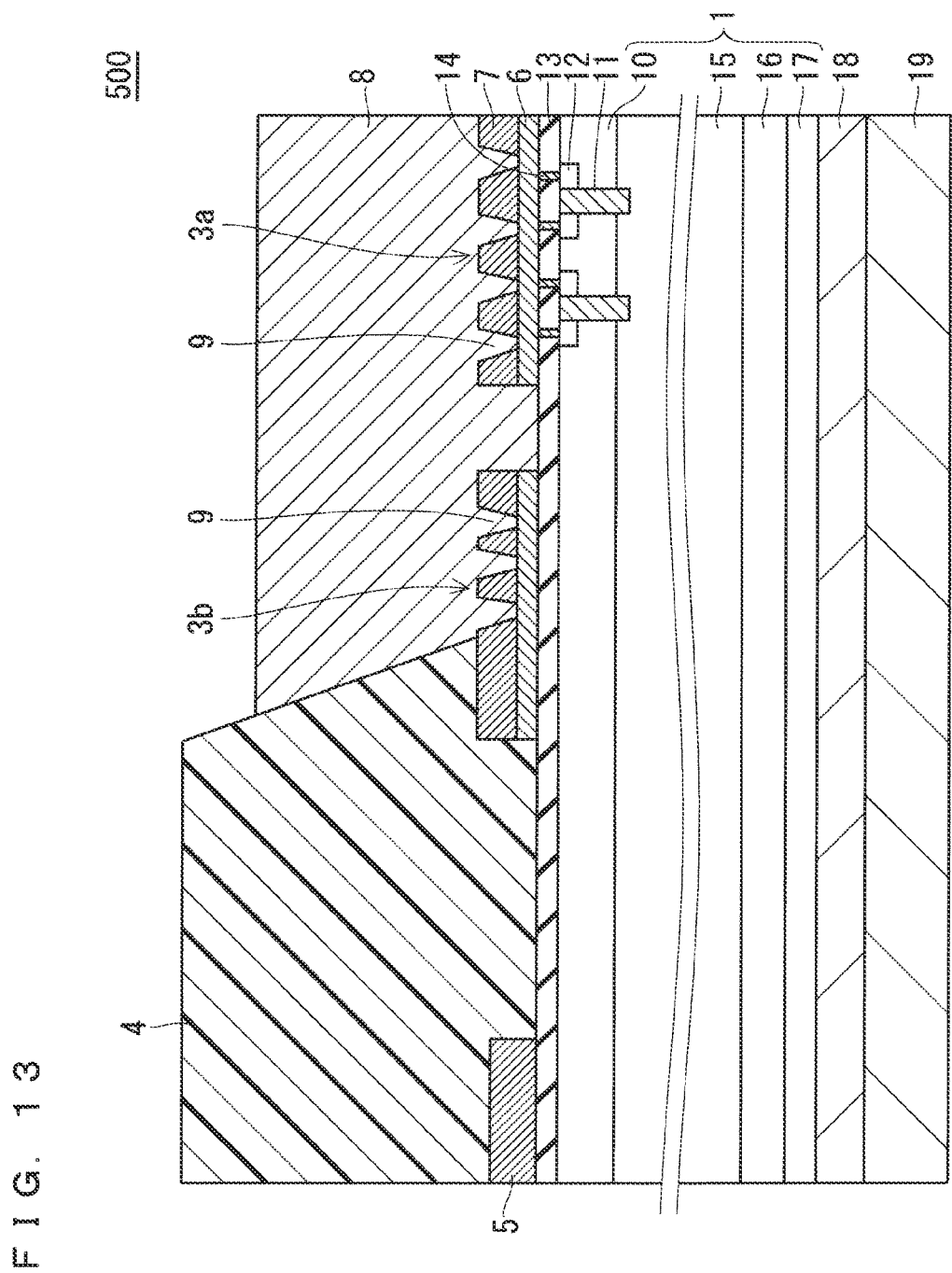
FIG. 13 A partial cross-sectional view illustrating a configuration of a semiconductor device according to an embodiment 5.

FIG. 13 is a cross-sectional view illustrating a configuration of an IGBT 500 of an embodiment 5 according to the present invention, and corresponds to a cross-sectional view along a B-B line in an arrow direction in FIG. 1. An upper surface configuration of the IGBT 500 is the same as a plan view of the IGBT 100 illustrated in FIG. 1.

As illustrated in FIG. 13, the IGBT 500 has a configuration that the trench gate electrode 11 is not provided in a lower part of the emitter outer peripheral electrode 3b, that is to say, a unit cell as a minimum unit structure of the IGBT is not included.

By adopting such a configuration, flatness of the metal layer 6 of the emitter outer peripheral electrode 3b is improved, a crack (interfacial debonding) occurring when a thermal cycle is applied to the IGBT 500 can extend more reliably in the horizontal direction at the interface between the metal layer 7 and the metal layer 6 in the emitter outer peripheral electrode 3b, and suppressed is an extension of debonding in a vertical direction, that is to say, in a thickness direction of the IGBT 500, thus suppressed is a breakdown of an element structure of the IGBT 500, and a life of a device can be made longer than ever before.

The trench gate electrode 11 is not provided in the lower part of the emitter outer peripheral electrode 3b, thus the number of unit cells in the IGBT 500 is reduced by an absence of the trench gate electrode 11. Accordingly, a length of the emitter outer peripheral electrode 3b in the horizontal direction is reduced as much as possible to suppress the reduction in the unit cell, and is set to approximately 5 μm, for example.

<Relationship Between Distance from Emitter Center Electrode to Emitter Outer Peripheral Electrode and Thickness of Plating Layer>

Figure 14:
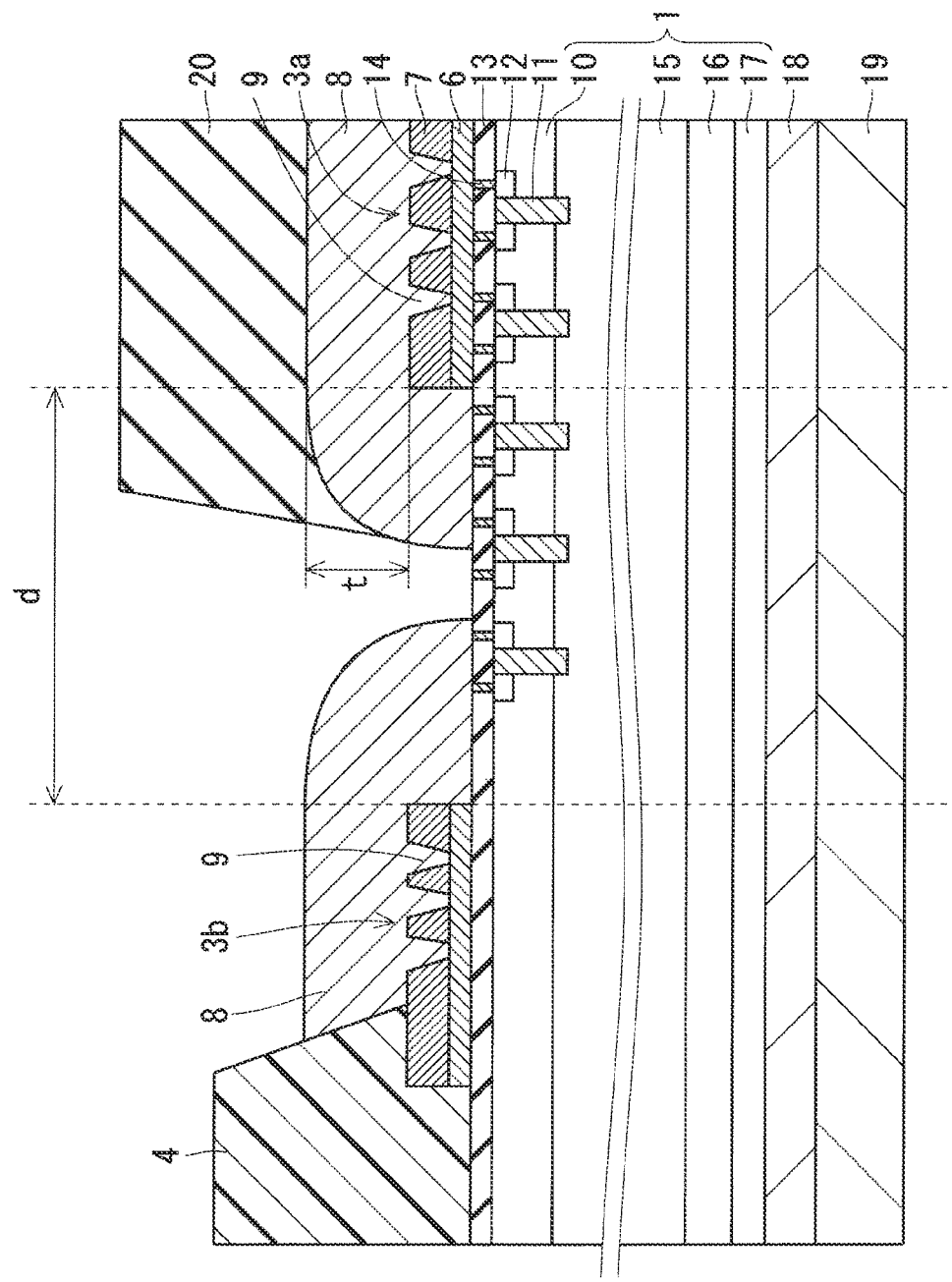
FIG. 14 A drawing for describing a relationship between a distance from an emitter center electrode to an emitter outer peripheral electrode and a thickness of a plating layer.

FIG. 14 is a drawing for describing a relationship between a distance from an emitter center electrode to an emitter outer peripheral electrode and a thickness of a plating layer, and is a drawing based on a cross-sectional view along the B-B line in the arrow direction in FIG. 1. FIG. 14 illustrates a case where a relationship between a distance d and a thickness t is d>2t wherein the distance from the emitter center electrode 3a to the emitter outer peripheral electrode 3b is d and the thickness of the plating layer 8 is t.

In this case, if the distance from the emitter center electrode 3a to the emitter outer peripheral electrode 3b is too large, there is a possibility that a solder layer 20 leaks over only on an upper side of the emitter center electrode 3*a* when the solder layer 20 is bonded to an upper side of the solder layer 8, and a crack in applying a thermal cycle occurs on the upper side of the emitter center electrode 3*a* and a life of a device is reduced.

In the meanwhile, the distance from the emitter center electrode 3*a* to the emitter outer peripheral electrode 3*b* is set so that the relationship between the distance d and the thickness t is expressed as d≤2t, thus the plating layer 8 formed on the emitter center electrode 3*a* and the emitter outer peripheral electrode 3*b* smoothly extends, and the solder layer 20 leaks over a whole upper side surface of the plating layer 8 on an upper side of the emitter center electrode 3*a* and the emitter outer peripheral electrode 3*b*. Thus, a crack in applying a thermal cycle easily occurs on the emitter outer peripheral electrode 3*b*.

In the IGBTs 100 to 500 in the embodiments 1 to 5, the relationship between the distance d and the thickness t is set to be expressed as d≤2t, thus the crack extends in the horizontal direction of the emitter outer peripheral electrode 3*b*.

Other Application Example

In the examples described in the embodiments 1 to 5, a trench gate type IGBT is described, however, the configurations in the embodiments 1 to 5 can be adopted to a planar gate type IGBT or a MOS transistor, and can also be adopted to various diodes such as a PN junction diode. Particularly, in a case of the planar gate type IGBT and the MOS transistor, the configuration in the embodiment 5 is particularly effectively, and flatness of the metal layer 6 of the emitter outer peripheral electrode 3*b* is significantly improved.

In the embodiments 1 to 5 described above, a material of the semiconductor substrate 1 is not particularly limited. The semiconductor substrate 1 may be made of silicon or SiC (silicon carbide), or may also be made of wide bandgap semiconductor other than silicon carbide such as gallium nitride (GaN), for example.

Particularly, SiC has high dielectric breakdown strength of approximately ten times as large as Si, and the thickness of the semiconductor layer can be reduced to approximately 1/10. Thus an SiC semiconductor device can achieve low ON voltage, and can operate under high temperature, thus a size can be reduced and efficiency can be increased in the SiC semiconductor device compared with an Si semiconductor device.

The present invention has been shown and described in detail, the foregoing description is in all aspects illustrative and not restrictive. It is therefore understood that numerous modifications and variations can be devised without departing from the scope of the invention.

According to the present invention, the above embodiments can be arbitrarily combined, or each embodiment can be appropriately varied or omitted within the scope of the invention.

The invention claimed is:

1. A semiconductor device in which main current flows in a thickness direction of a semiconductor substrate, wherein
the semiconductor substrate includes:
an active region in which the main current flows; and
a terminal region located on an outer side of the active region,
the semiconductor device includes:
a first main electrode provided on the active region;
a second main electrode provided on an opposite side of the semiconductor substrate from the first main electrode;
a protection film covering at least the terminal region; and
a non-electrolytic plating layer provided on the first main electrode not covered by the protection film,
the first main electrode includes a center electrode in a center part and an outer peripheral electrode provided along the center electrode to be separately from the center electrode,
the protection film is provided to extend from the terminal region to an end edge portion of the outer peripheral electrode,
the center electrode and the outer peripheral electrode include:
a first metal layer; and
a second metal layer including aluminum provided on the first metal layer, and
at least the outer peripheral electrode includes a hole part passing through the second metal layer to reach the first metal layer.

2. The semiconductor device according to claim 1, wherein
the hole part is a hole formed by pitting corrosion in preprocessing prior to a formation of the non-electrolytic plating layer.

3. The semiconductor device according to claim 2, wherein
the second metal layer is made of aluminum-silicon alloy, and
a silicon concentration of the second metal layer of the outer peripheral electrode is higher than a silicon concentration of the second metal layer of the center electrode.

4. The semiconductor device according to claim 1, wherein
the hole part is a hole selectively formed.

5. The semiconductor device according to claim 2, wherein
the center electrode includes the hole part, and
a thickness of the second metal layer of the center electrode is set to be larger than a thickness of the second metal layer of the outer peripheral electrode, and large enough so that the hole part does not pass through the second metal layer.

6. The semiconductor device according to claim 1, wherein
the active region does not include a unit cell as a minimum unit structure of the semiconductor device on a lower side of the outer peripheral electrode.

7. The semiconductor device according to claim 1, wherein
a distance from the center electrode to the outer peripheral electrode is set to be smaller than a thickness of the non-electrolytic plating layer.

8. The semiconductor device according to claim 2, wherein
the thickness of the second metal layer is set to be equal to or larger than 0.5 µm.

9. The semiconductor device according to claim 4, wherein
the thickness of the second metal layer of the center electrode and the thickness of the second metal layer of the outer peripheral electrode are set to be equal to or larger than 1.5 µm.

10. The semiconductor device according to claim 5, wherein the thickness of the second metal layer of the center electrode is set to be equal to or larger than 1.5 µm, and the thickness of the second metal layer of the outer peripheral electrode is set to be equal to or larger than 0.5 µm.

* * * * *